United States Patent [19]
Komuro

[11] Patent Number: 5,353,255
[45] Date of Patent: Oct. 4, 1994

[54] SEMICONDUCTOR DYNAMIC RANDOM-ACCESS MEMORY DEVICE

[75] Inventor: Toshio Komuro, Tokyo

[73] Assignee: NEC Corporation, Tokyo, Japan

[21] Appl. No.: 11,776

[22] Filed: Feb. 1, 1993

[30] Foreign Application Priority Data

Feb. 27, 1992 [JP] Japan .................................. 4-040009

[51] Int. Cl.⁵ .............................................. G11C 7/00
[52] U.S. Cl. .................................... 365/208; 365/149; 365/203; 365/207; 365/51
[58] Field of Search ............... 365/208, 149, 203, 207, 365/51

[56] References Cited

U.S. PATENT DOCUMENTS 4,920,517  4/1990  Yamauchi et al. .................. 365/207
4,926,382  5/1990  Sakui et al. ......................... 365/149

Primary Examiner—Eugene R. LaRoche
Assistant Examiner—Huan Hoang
Attorney, Agent, or Firm—Sughrue, Mion, Zinn, Macpeak & Seas

[57] ABSTRACT

A semiconductor memory device having memory cells each comprising a single transistor and a single capacitor. The memory device has two kinds of bit line pairs, a main bit line pair and a sub-bit line pair. Some memory cells are connected to the first main bit line with their capacitor sides and to the second sub-bit line with their transistor sides. Other memory cells are connected to the second main bit line with their capacitor sides and to the first sub-bit line with their transistor sides. A sub-sense amplifier is provided to amplify and transmit the difference voltage of the sub-bit line pair to the main bit line pair. The main bit line pair is connected to a main sense amplifier which amplifies and outputs the difference voltage of the main bit line pair.

11 Claims, 5 Drawing Sheets

SEMICONDUCTOR DYNAMIC RANDOM-ACCESS MEMORY DEVICE

BACKGROUND OF THE INVENTION

1. Field of the Invention

The present invention relates to a semiconductor memory device, particularly to a dynamic random access memory (dynamic RAM) device having memory cells each comprising a single transistor and a single capacitor.

2. Description of the Related Art

As the memory capacity of semiconductor memory devices increases, an internal step-down circuit or the like is required to generate a voltage lower than the source voltage supplied from outside to operate the internal circuits of the devices. When they are operated with a lowered voltage of this sort, for example, in dynamic RAMs having memory cells each comprising a single transistor and a single capacitor, the charge storage of the memory cells become small, and the operation margin of the memory cells for sense amplification is also reduced. In order to prevent the above reduction of the operation margin, two methods have been taken to secure the signal level to be input into a sense amplifier. One of the methods is to increase the electric capacity of a capacitor of each memory cell, and the other is to reduce capacitance of the bit line which connects the memory cell and the sense amplifier.

However, with the method for providing the memory cell with a large capacitance, it becomes necessary to form a capacitance with a predesignated capacity within the memory cell which tends to become relatively smaller while meeting further increasing memory capacity of the semiconductor memory device, thereby requiring a thinner insulation film of the capacitor which also involves the expected risk of coming close to the physical limit. On the other hand, in order to reduce the capacitance of the bit line according to the other method, for example, the length of the bit line can be reduced by decreasing the number of memory cells to be connected to a bit line pair; however, this method increases the number of sense amplifiers and concomitantly increases the number of precharge circuits and transfer gates for data transfer, so that it is not suitable for use in high integration of the memory cell. Therefore, conventional dynamic RAMs have the drawback that it is difficult to prevent reduction of the operation margin of the sense amplifiers when they are operated with a lowered voltage.

SUMMARY OF THE INVENTION

An object of the present invention is to provide a semiconductor memory device which can secure a sufficient operation margin of a sense amplifier even when it is operated with a lowered voltage.

The object of the present invention is achieved by the semiconductor memory device having memory cells composed of a single transistor and a single capacitor, which semiconductor memory device comprises first and second main bit lines composing a main bit line pair, a precharge circuit for precharging each said main bit line to a predetermined potential according to a precharge signal, a main sense amplifier for amplifying signals between said paired main bit lines, a sub-bit line pair provided for said main bit line pair being composed of first and second sub-bit lines, not less than two memory cells provided for each said sub-bit line pair, a plurality of word lines for selecting a specified memory cell from among said plurality of memory cells, a sub-sense amplifier provided for each said sub-bit line pair for amplifying the voltage between said paired sub-lines lines for the purpose of transmitting the voltage thereof to said main bit line pair, wherein each said memory cell comprises a single MOS transistor and a single capacitor, the channel of said MOS transistor and said capacitor being serially connected to each other, and a word line corresponding to said memory cell is connected to the gate of said MOS transistor, some of said memory cells are connected to the first main bit line by said capacitor sides and to the second sub-bit line by said channel sides, and other memory cells are connected to the second main bit line by said capacitor sides and to the first sub-bit line by said channel sides.

The above and other objects, features and advantages of the present invention will become apparent from the following description referring to the accompanying drawings which illustrate examples of preferred embodiments of the present invention.

DETAILED DESCRIPTION OF THE PREFERRED EMBODIMENTS

Figure 1:
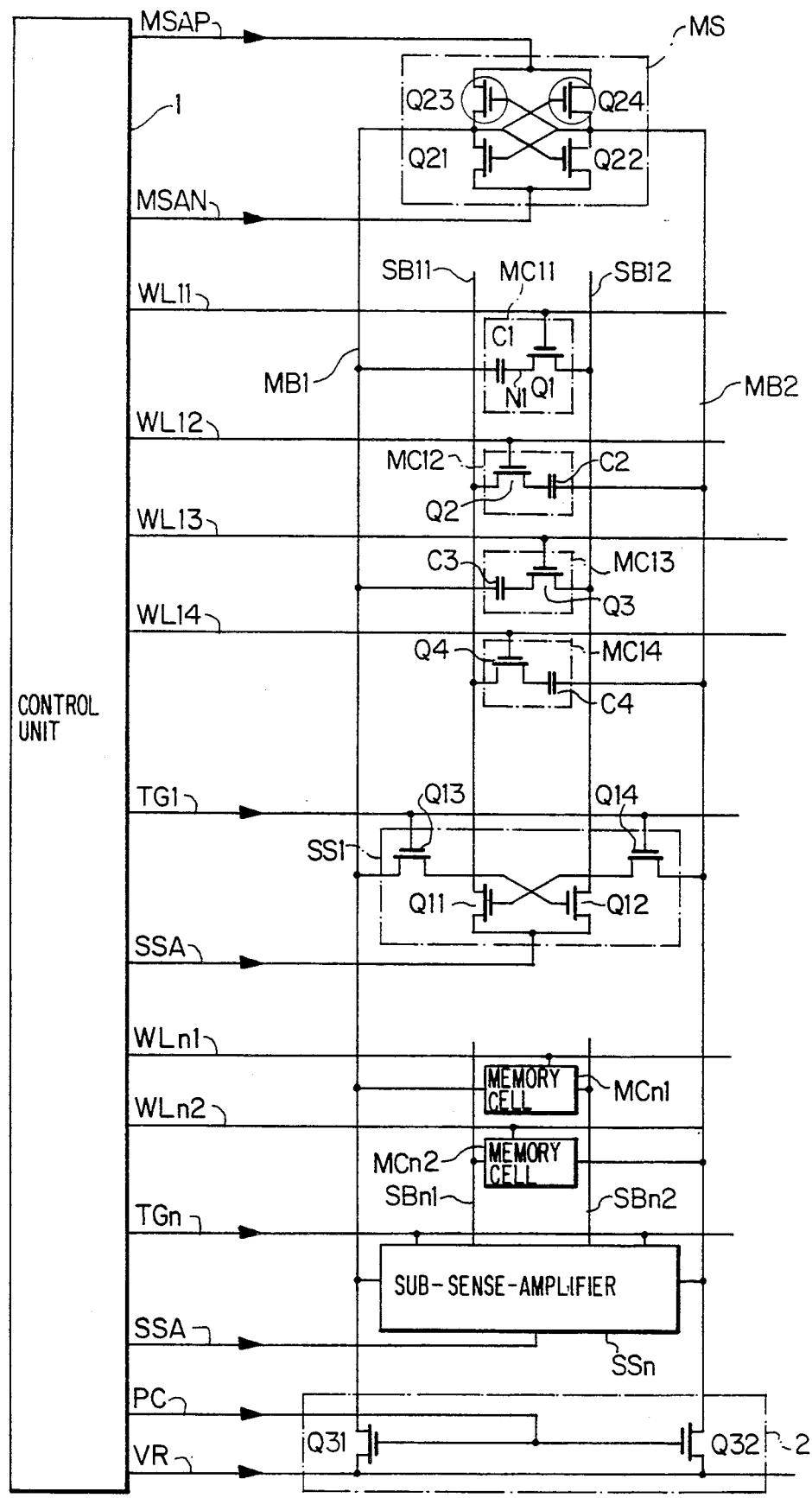
FIG. 1 is a block diagram showing the semiconductor memory device of a first preferred embodiment of the present invention.

The semiconductor memory device shown in FIG. 1 has two kinds of sense amplifiers, a main sense amplifier and a sub-sense amplifier.

Main sense amplifier MS is provided and corresponds one-to-one to precharge circuit 2 being connected thereto through main bit line pair MB1/MB2, which pair is further connected to an external data line pair through a transfer gate (not shown). Main sense amplifier MS has a publicly known CMOS structure comprising nMOS transistors Q21, Q22, pMOS transistors Q23, Q24. The sources of pMOS transistors Q23, Q24 are commonly connected and supplied with main sense amplifier activation signal MSAP, and the sources of nMOS transistors Q21, Q22 are commonly connected and supplied with main sense amplifier activation signal MSAN. The drains of transistors Q21, Q23 are commonly connected, and to this connection point each gate of transistors Q22, Q24 and first main bit line MB1 are connected. In the same way, the drains of transistors Q22, Q24 are commonly connected, and to this connection point each gate of transistors Q21, Q23 and second main bit line MB2 are connected.

Precharge circuit 2 is composed of two transistors Q31, Q32, and precharge signal PC is supplied to the gates of transistors Q31, Q32. The channels of transistors Q31, Q32 connect between the supply line of precharge potential VR and first main bit line MB1 and between the supply line of precharge potential VR and second main bit line MB2, respectively.

Main bit line pair MB1/MB2 composed of first and second main bit lines MB1, MB2 is provided with a plurality of sub-sense amplifiers SS1 to SSn. To each of sub-sense amplifiers SS1 to SSn, sub-bit line pairs SB11/SB12 to SBn1/SBn2 are connected, respectively. Since each of sub-sense amplifiers SS1 to SSn has the same structure and each of sub-bit line pairs SB11/SB12 to SBn1/SBn2 is in the same connecting relation to the above amplifier, descriptions will be made here with reference to sub-sense amplifier SS1 and sub-bit line pair SB11/SB12 as examples.

Sub-bit line pair SB11/SB12 comprises first and second sub-bit lines SB11, SB12, and sub-sense amplifier SS1 is composed of four transistors Q11 to Q14. The sources of transistors Q11, Q12 are commonly connected, and it is so arranged that sub-sense amplifier activation signal SSA is supplied to this connection point. First sub-bit line SB11 and the gate of transistor Q12 are connected to the drain of transistor Q11. In the same manner, second sub-bit line SB12 and the gate of transistor Q11 are connected to the drain of transistor Q12. Transistors Q11, Q12 constitute an amplifier which amplifies the potential between paired sub-bit lines SB11/SB12.

On the other hand, transistors Q13, Q14 are arranged so as to receive transfer control signal TG1 for sub-sense amplifier SS1 which is inputted into their gates. First main bit line MB1 and first sub-bit line SB11 are connected by the channel of transistor Q13, and second main bit line MB2 and second sub-bit line SB12 are connected by the channel of transistor Q14. In other words, transistors Q13, Q14 each constitute transfer circuits.

A plurality of memory cells MC11, MC12, . . . are provided corresponding to the pair of sub-bit lines SB11/SB12. Each memory cell is composed of a single transistor and a single capacitor, with the channel of the transistor and the capacitor serially connected. In first memory cell MC11, the gate of transistor Q1 is connected to word line WL11 which corresponds to memory cell MC11. About the serial connection of capacitor C1 and the channel of transistor Q1, one end of the serial connection to which capacitor C1 is not connected is connected to second sub-bit line SB12, and the other end the connection to which transistor Q1 is not connected is connected to first main bit line MB1. In second memory cell MC12, word line WL12 is connected to the gate of transistor Q2, one end of the serial connection of transistor Q2 and capacitor C2 to which capacitor C2 is not connected is connected to first sub-bit line SB11, and the other end of the connection to which transistor Q2 is not connected is connected to second main bit line MB2. In the same way, in third memory cell MC13, capacitor C3 is connected to first main bit line MB1, while transistor Q4 is connected to second sub-bit line SB12, and in fourth memory cell MC14, capacitor C4 is connected to second main bit line MB2, while transistor Q4 is connected to first sub-bit line SB11.

Sub-sense amplifiers and sub-bit line pairs other than above sub-sense amplifier SS1 and sub-bit line pair SB11/SB12 are also each provided with a plurality of memory cells. In FIG. 1, sub-sense amplifier SSn and sub-bit line pair SBn1/SBn2 are shown being provided with memory cells MCn1, MCn2.

Further, this semiconductor memory device is provided with control unit 1 which outputs selection signals to word lines WL11, WL12, . . . , WLn1, WLn2 provided for selecting a specific memory cell, precharge potential VR, and which generates main sense amplifier activation signals MSAP, MSAN, transfer control signals TG1, . . . , TGn, sub-sense amplifier activation signal SSA, and precharge signal PC. Specifically, in the initial state, control unit 1 renders precharge signal PC and transfer control signals TG1, . . . , TGn into an active level, main sense amplifier activation signals MSAP, MSAN and sub-sense amplifier activation signal SSA into an inactive level, and each word line WL11, WL12, . . . , WLn1, WLn2 into a nonselected level. Further, control unit 1 is structured so as to output signals successively according to the following sequence, when it refreshes data of any memory cell or when it transits to the state for reading data from the memory cell, i.e., the operation state:

(1) after rendering transfer control signals TG1, . . . , TGn inactive, renders a word line corresponding to the memory cell to be selected into a selected level.

(2) renders precharge signal PC into an inactive level and sub-sense amplifier activation signal SSA into an active level.

(3) after rendering a transfer control signal of a sub-sense amplifier which corresponds to the memory cell to be read into the active level, renders main sense amplifier activation signals MSAP, MSAN into the active level.

(4) after rendering word lines into the nonselected level, renders precharge signal PC into the active level, and sub-sense amplifier activation signal SSA and main sense amplifier activation signals MSAP, MSAN into the inactive level.

Figure 2:
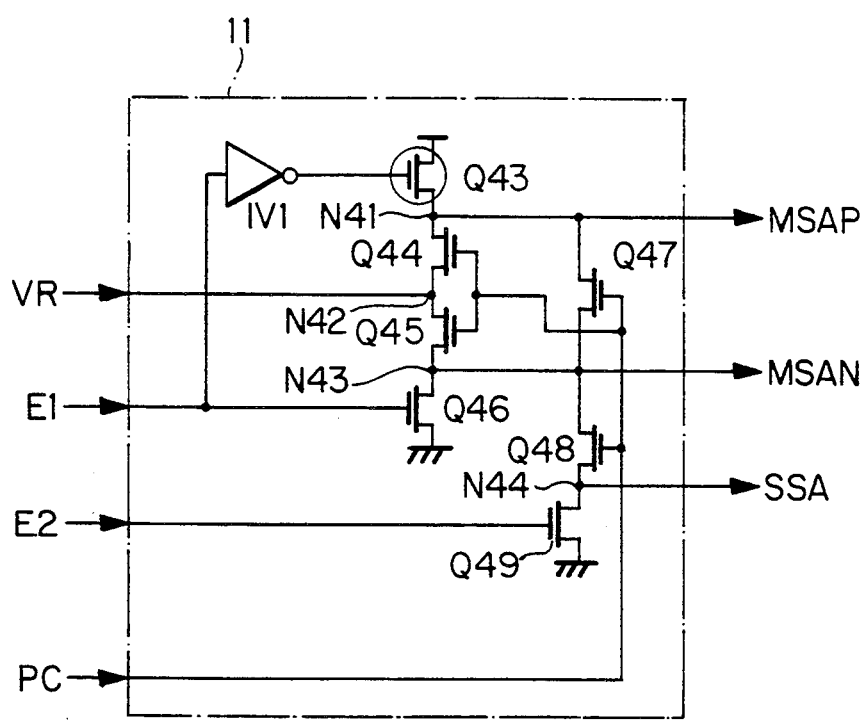
FIG. 2 is a circuit diagram showing an example of the structure of a sense controller with reference to the control unit of the device shown in FIG. 1.

Although the structure of control unit 1 which outputs signals according to the above sequence should be apparent to the person skilled in the art, an example of the structure of sense controller 11 in control unit 1 will be described below with reference to FIG. 2. Sense controller 11 is a circuit block for producing main sense amplifier activation signals MSAP, MSAN and sub-sense amplifier activation signal SSA.

Sense controller 11 is composed of inverter IV1, pMOS transistor 43 and six nMOS transistors Q44 to Q49, and precharge potential VR, two control signals E1, E2, and precharge signal PC are inputted thereinto. The channels of four transistors Q43 to Q46 are serially connected from the power source side to the ground side. Control signal E1 is inputted into inverter IV1, and the output of inverter IV1 is connected to the gate of transistor Q43. Main sense amplifier activation signals MSAP, MSAN are outputted from common connection point N41 of transistors Q43, Q44 and common connection point N43 of transistors Q45, Q46, respectively. Precharge potential VR is supplied to common connection point N42 of transistors Q44, Q45. Further, transistor Q47 is connected between common connection points N41, N43, and transistors Q48, Q49 are serially connected from connection point N43 side toward the ground side. Sub-sense amplifier activation signal SSA is outputted from common connection point N44 of transistors Q48, Q49. Other control signal E2 is supplied to the gate of transistor Q49, and precharge signal PC to the gates of transistors Q44, Q45, Q47, Q48.

Figure 3:
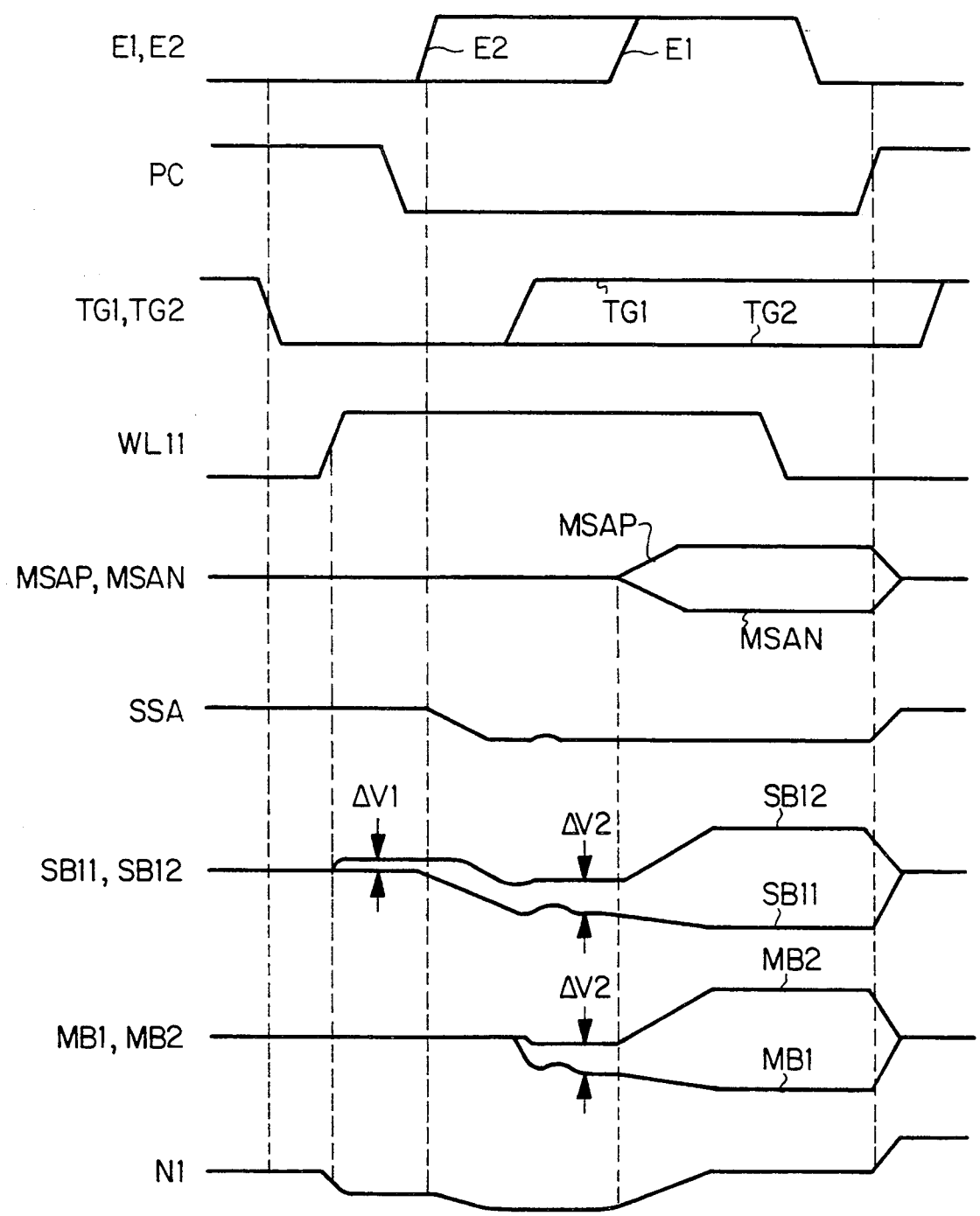
FIG. 3 is a timing chart for explaining operation of the device shown in FIG. 1.

Operation of this semiconductor memory device will be described with reference to the timing chart in FIG. 3.

In the initial state, since control signals E1, E2 both have a low voltage, transistors Q43, Q46, Q47 are all rendered into the cut-off state, and main sense amplifier activation signals MSAP, MSAN and sub-sense amplifier activation signal SSA are all made to have a potential equivalent to precharge potential VR. Since each of precharge signal PC, and transfer control signals TG1, ..., TGn is in the active level with a high potential, each of main bit lines MB1, MB2 is charged to precharge potential VR. Further, each of sub-bit lines SB11, SB12, ..., SBn1, SBn2 is also held in precharge potential VR through sub-sense amplifiers SS1, ..., SSn. Description will be made below, for the sake of simplification, laying stress on the operation of sub-sense amplifier SS1 and sub-bit line pair SB11/SB12 connected thereto; however, the person skilled in the art will be able to easily understand the operation of other sub-sense amplifiers and pairs of sub-bit lines.

when any memory cell is refreshed or when the state transits to the state for reading data from the memory cells, i.e., the operation state, each of transfer control signals TG1, ..., TGn is first rendered into the inactive level with a low voltage, thereby electrically separating main bit line pair MB1/MB2 and sub-bit line pair SB11/SB12. At this time, precharge signal PC has a high potential, and the potential of the opposite electrodes (electrodes in the sides of main bit lines MB1, MB2) of each of capacitors C1 to C4 of each of memory cells MC11 to MC44 is kept to precharge potential VR.

When it is assumed that memory cell MC11 is selected, word line WL11 corresponding to memory cell MC11 becomes the selected level with a high potential and transistor Q1 of memory cell MC11 is activated to connect memory cell MC11 and second sub-bit line SB12. Since the capacitor of memory cell MC11 is charged in advance corresponding to either of binary data "0" or "1", signal difference voltage ΔV1 is generated between second sub-bit line SB12 and first sub-bit line SB11. In this moment, first sub-bit line SB11 successively remains in precharge potential VR. Although whether the potential of second sub-bit line SB12 is higher or lower than that of first sub-bit line SB11 when compared depends on the data written in memory cell MC11, it is assumed here that second sub-bit line SB12 has a relatively higher potential than line SB11.

Subsequently, by rendering control signal E2 into the high potential, transistor Q49 is electrified and sub-sense amplifier activation signal SSA is rendered into the active level with the a voltage. Then, transistors Q11, Q12 of sub-sense amplifier SS1 operate as a sense amplifier to amplify difference voltage ΔV1 between sub-bit lines SB11 and SB12.

When potential difference between paired sub-bit lines SB11/SB12 is sufficiently amplified, transfer control signal TG1 corresponding to sub-sense amplifier SS1 is rendered into the a potential to electrify transistors Q13, Q14, thereby transmitting the difference voltage between paired sub-bit lines SB11/SB12 to main bit line pair MB1/MB2. However, it is necessary to render precharge signal PC into a low potential and finish precharging the pair of main bit lines MB1/MB2 before rendering transfer control signal TG1 into the high potential.

By transmitting the difference voltage between paired sub-bit lines SB11/SB12 to main bit line pair MB1/MB2, difference voltage ΔV2 is generated between paired main bit lines MB1/MB2. Then, by elevating control signal E1 to a higher potential, transistors Q43, Q46 are electrified and main sense amplifier activation signals MSAP, MSAN are made to have the source potential and the ground potential, respectively, both being in the activated level to further activate main sense amplifier MS. As a result, difference voltage ΔV2 between paired main bit lines MB1/MB2 is amplified. At this time, since main bit line pair MB1/MB2 and sub-bit line pair SB11/SB12 are electrically connected, the voltage between paired sub-bit lines SB11/SB12 is further amplified, and thus memory node N1 (the connection point of transistor Q1 and capacitor C1) of memory cell MC11 is refreshed. The timing chart in FIG. 3 shows, as described above, the operation of the memory device when the initial potential of memory node N1 is high. Next, word line WL11 transits to the nonselected level with the low voltage, and at the time of this transition, memory node N1 is refreshed up to the potential of main sense amplifier activation signal MSAP.

Thereafter, by making control signals E1, E2 have the low voltage, every potential of main sense amplifier activation signals MSAP, MSAN, sub-sense amplifier activation signal SSA, main bit lines MB1, MB2, and sub-bit lines SB11 and SB12 is precharged to precharge potential VR. At this time, since the potential of first main bit line MB1 is boosted from the low potential to precharge potential VR, the potential of memory node N1 of memory cell MC11 is further boosted to exceed the source voltage, thereby achieving a large operation margin in sense amplification.

As a result, the transfer control signals being in the inactive level among transfer control signals TG1, ..., TGn, i.e., the transfer control signals other than signal TG1, are made to enter into the active level with the high potential and are transited to the initial state.

The operation of the semiconductor memory device shown in FIG. 1 is described above, the device having a high potential charge stored in memory node N1 of memory cell MC11 in the initial state. In case a low potential charge is stored in memory node N1 in the initial state, the potential of first main bit line MB1 drops from the high level to precharge potential VR when control signals E1, E2 switch to the low potential, so that the potential of memory node N1 is lower than the ground potential, resulting in a large operation margin in sense amplification as described above.

Next, a second preferred embodiment of the present invention will be described.

Figure 4:
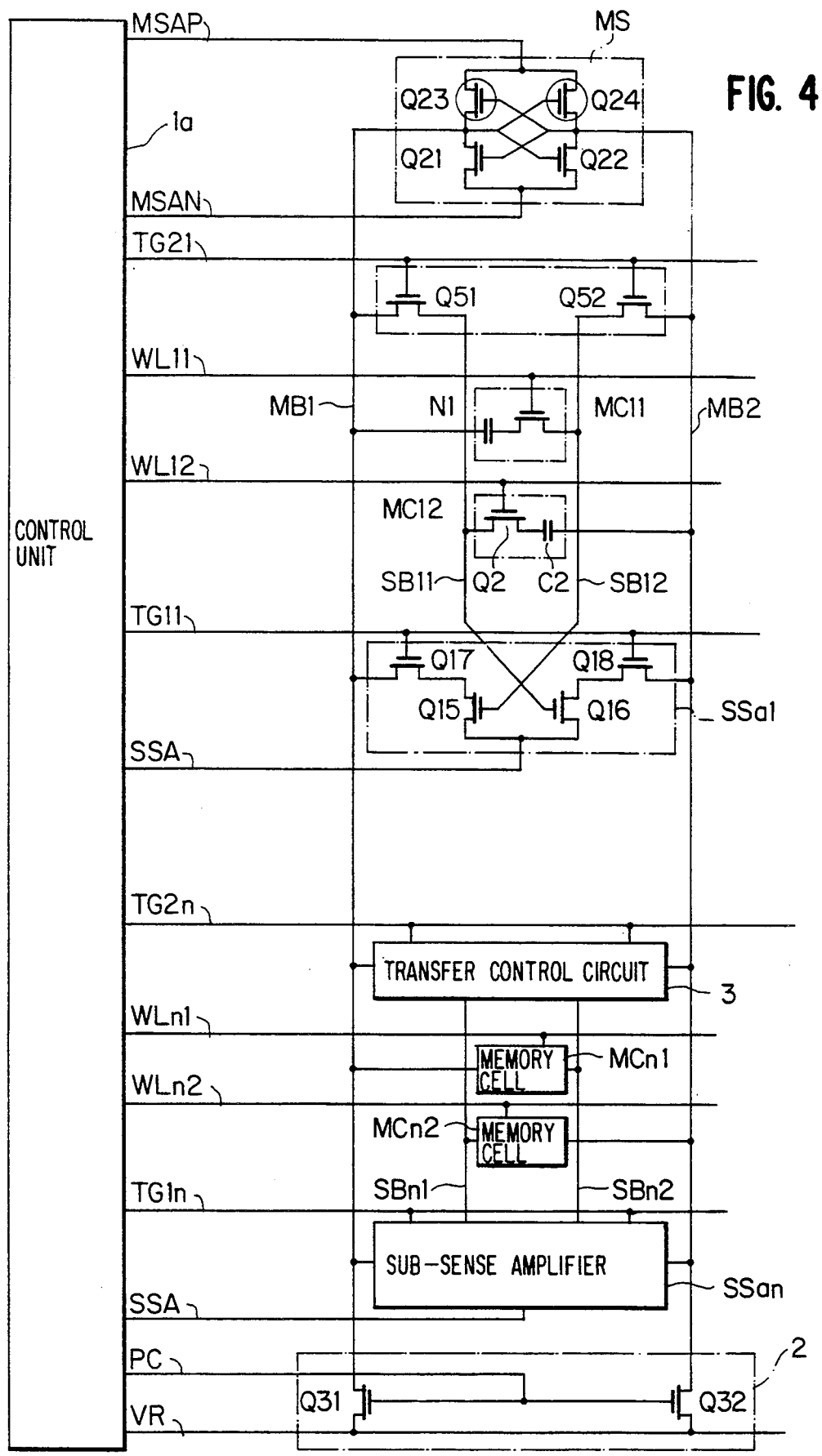
FIG. 4 is a block diagram of the semiconductor memory device of a second preferred embodiment of the present invention; and, FIG. 5 is a timing chart for explaining operation of the device shown in FIG. 2.

The semiconductor memory device shown in FIG. 4 is approximately similar to the above first embodiment; however, it differs from the first embodiment in that it comprises a transfer control circuit for every pair of sub-bit lines, a sub-sense amplifier of a different structure, and first and second transfer control signals for each sub-bit line pair which are outputted from the control unit. Each function block in FIG. 4 carrying the same reference number as that in FIG. 1 has the same function as that having the same reference number in the first embodiment.

Sub-sense amplifier SSa1 comprises four transistors Q15 to Q18. The sources of transistors Q15, Q16 are commonly connected, and sub-sense amplifier activation signal SSA is supplied to this connection point. The gate of transistor Q15 is connected to second sub-bit line SB12, while the gate of transistor Q16 is connected to first sub-bit line SB11. First transfer control signal TG11 is supplied to the gates of each of transistors Q17, Q18, the drain of transistor Q15 and first main bit line MB1 are connected through the channel of transistor Q17, and the drain of transistor Q16 and second main bit line MB2 are connected via the channel of transistor Q18. Obviously, sub-sense amplifiers of a similar structure are also provided in sub-bit line pairs other than sub-bit line pair SB11/SB12. For example, sub-sense amplifier SSan which receives first transfer control signal TG1n is provided for sub-bit line pair SBn1/SBn2. Separately, transfer control circuit 3 provided for sub-bit line pair SB11/SB12 comprises two transistors Q51, Q52 each having a gate to receive second transfer control signal TG21, wherein the channel of transistor Q51 serves to connect first main bit line MB1 and first sub-bit line SB11, and the channel of transistor Q52 serves to connect second main bit line MB2 and second sub-bit line SB12.

Controller 1a of this semiconductor memory device outputs selection signals to word lines WL11, WL12, . . . , WLn1, WLn2, and precharge potential VR, and generates main sense amplifier activation signals MSAP, MSAN, first transfer control signals TG11, . . . , TG1n, second transfer control signals TG21, . . . , TG2n, sub-sense amplifier activation signal SSA, and precharge signal PC. Specifically, in the initial state, controller1 a renders precharge signal PC and second transfer control signals TG21, . . . , TG2n into the active level, first transfer control signals TG11, . . . , TG1n, main sense amplifier activation signals MSAP, MSAN and sub-sense amplifier activation signal SSA into the inactive level, and word lines WL11, WL12, . . . , WLn1, WLn2 into the nonselected level. Further, controller 1a is structured so as to output signals successively according to the following sequence, when it refreshes data of any memory cell or when it transits to the state for reading data from the memory cell i.e., the operation state:

(1) after rendering second transfer control signals TG21, . . . , TG2n inactive, renders a word line corresponding to the memory cell to be selected into a selected level.

(2) after rendering precharge signal PC into an inactive level and all of first transfer control signals TG11, . . . , TG1n corresponding to the memory cell to be read into an active level, renders sub-sense amplifier activation signal SSA into the active level.

(3) after rendering main sense amplifier activation signals MSAP, MSAN into the active level, renders second transfer control signals TG21, . . . , TG2n into the active level.

(4) after rendering word lines into the nonselected level and all of first transfer control signals TG11, . . . , TG1n corresponding to the memory cell to be read into the inactive level, renders precharge signal PC into the active level, and sub-sense amplifier activation signal SSA and main sense amplifier activation signals MSAP, MSAN into the inactive level.

Since the structure of controller1 a which outputs signals according to the above sequence is the same as that of control unit 1 of the semiconductor memory device shown in FIG. 1, it can easily be understood by the person skilled in the art.

Figure 5:
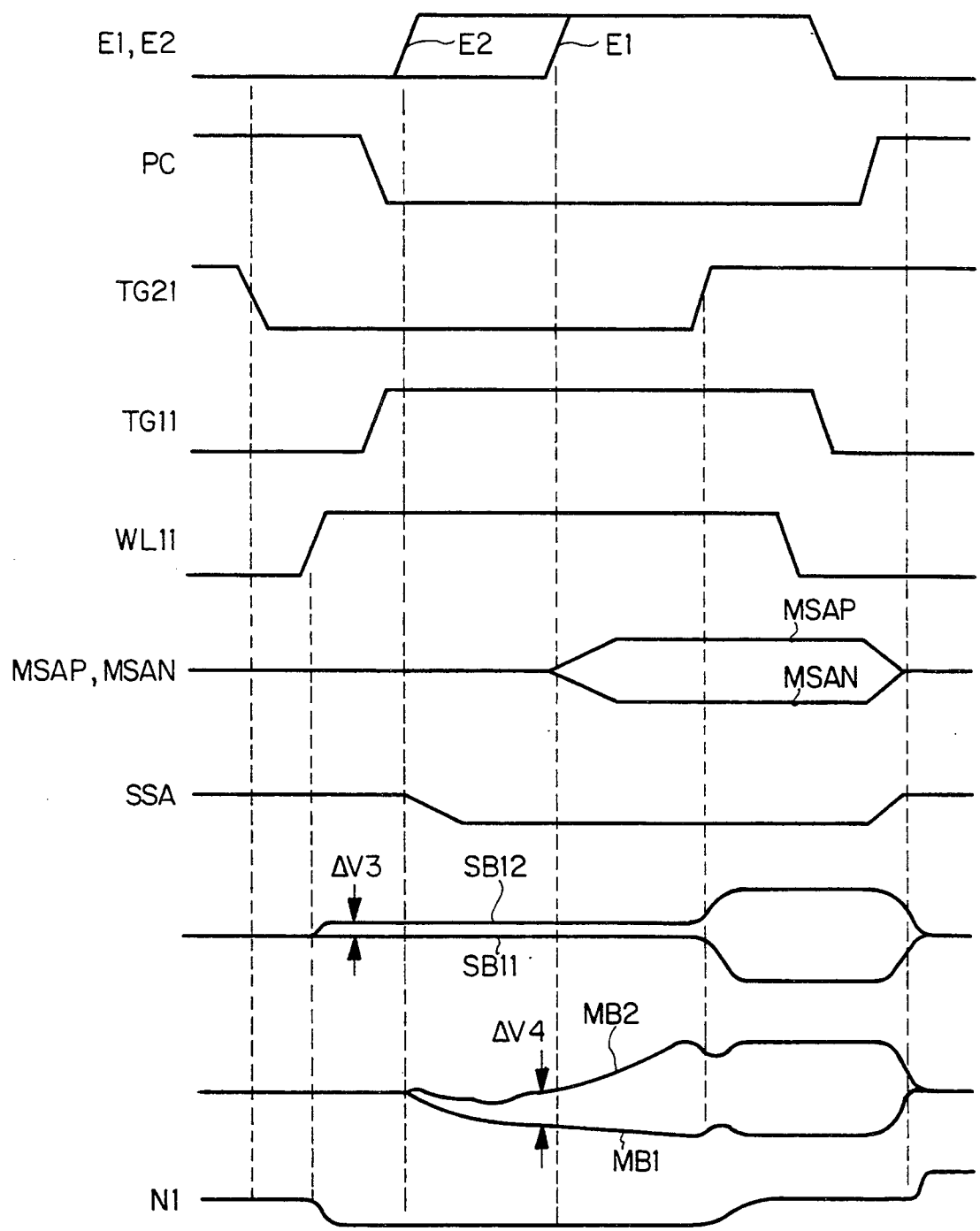

Operation of this semiconductor memory device will be described according to the timing chart in FIG. 5.

In the initial state, main sense amplifier activation signals MSAP, MSAN and sub-sense amplifier activation signal SSA are all made to have a potential equivalent to precharge potential VR. Since each of precharge signal PC, and second transfer control signals TG21, . . . , TG2n is in the active level with a high potential, each of main bit lines MB1, MB2 is charged to precharge potential VR: further, each of sub-bit lines SB11, SB12, . . . , SBn1, SBn2 is held in precharge potential VR. Separately, since first transfer control signals TG11, . . . , TG1n are in the inactive level with a low potential, each of sub-sense amplifiers SSa1, . . . , SSan is kept separate from the pair of main bit lines MB1/MB2. Description will be made below, for the sake of simplification, centering on the operation of sub-sense amplifier SSa1 and sub-bit line pair SB11/SB12 connected thereto; however, the person skilled in the art will be able to easily understand the operation of other sub-sense amplifiers and sub-bit line pairs.

When any memory cell is refreshed or when the state transits to the state for reading data from the memory cells, i.e., the operation state, second transfer control signals TG21, . . . , TG2n are first rendered into the inactive level, thereby electrically separating main bit line pair MB1/MB2 and sub-bit line pair SB11/SB12. At this time, precharge signal PC has a high potential and the potential of the opposite electrodes (the electrodes in the sides of main bit lines MB1, MB2) of each of capacitors C1 to C4 of each of memory cells MC11 to MC44 is kept to precharge potential VR.

When it is assumed that memory cell MC11 is selected, word line WL11 corresponding to memory cell MC11 becomes the selected level with a high potential and transistor Q1 of memory cell MC11 is activated to connect memory cell MC11 and second sub-bit line SB12. Since the capacitor of memory cell MC11 is charged in advance corresponding to either of binary data "0" or "1", signal difference voltage $\Delta V3$ is generated between second sub-bit line SB12 and first sub-bit line SB11. In this moment, first sub-bit line SB11 is successively held in precharge potential VR. Although whether the potential of second sub-bit line SB12 is higher or lower than that of first sub-bit line SB11 when compared depends on the data written in memory cell MC11, it is assumed here that second sub-bit line SB12 has a relatively higher potential than line SB11.

Subsequently, precharge signal PC is turned to have a low potential to finish precharging of the pair of main bit lines MB1/MB2, first transfer control signal TG11 corresponding to memory cell MC11 is turned to have a high potential to activate transistors Q17, Q18, sub-sense amplifier SSa1 and main bit line pair MB1/MB2 are connected, and sub-sense amplifier activation signal SSA is rendered into the activated level with a low potential. Then sub-sense amplifier SSa1 starts to operate to amplify difference voltage $\Delta V3$ between paired sub-bit lines SB11/SB12, which is in turn outputted to paired main bit lines MB1/MB2 as difference voltage $\Delta V4$.

Then, main sense amplifier activation signals MSAP, MSAN are made to have the source potential and the ground potential, respectively, each possessing the activated level to further activate main sense amplifier MS. As a result, difference voltage $\Delta V4$ between paired main bit lines MB1/MB2 is amplified. Then by making second transfer control signals TG21, . . . , TG2n have the high potential, main bit line pair MB1/MB2 and sub-bit line pair SB11/SB12 are connected to transmit the amplified difference voltage to sub-bit line pair SB11/SB12. As a result, memory node N1 of memory cell MC11 is refreshed. The timing chart in FIG. 5 shows, as described above, operation of the memory device when the initial potential of memory node N1 is high. Next, word line WL11 transits to the nonselected level with the low voltage. At the time of this transition, memory node N1 is refreshed up to the potential of main sense amplifier activation signal MSAP.

Thereafter, each signal transits to the initial state; however, since the potential of first main bit line MB1 is boosted from the low potential to precharge potential VR, the potential of memory node N1 of memory cell MC11 is further boosted to exceed the source voltage, thereby achieving a large operation margin in sense amplification. Similarly, in case a low potential charge is stored in memory node N1 at the initial state, since the potential of first main bit line MB1 drops from the high level to precharge voltage VR when a series of the operational sequence is finished and transited to the initial state, the potential of memory node N1 is reduced lower than the ground potential, resulting in a large operation margin in sense amplification as above.

Although the embodiments of the present invention have been described above, since the semiconductor memory device of the present invention is structured such that the counter electrode (the electrode in the side not connected to the transistor) of the capacitor of each memory cell is connected to the main bit line, and a bit line of the conventional semiconductor memory device is used as the sub-bit line of the device, it can be manufactured in the usual manufacturing process of semiconductor devices without increasing the number of wiring layers by utilizing conductive layers composing counter electrodes of the capacitor as conductive layers for the main bit line.

It is to be understood that variations and modifications of the semiconductor memory device disclosed herein will be evident to those skilled in the art. It is intended that all such modifications and variations be included within the scope of the appended claims.

What is claimed is:

1. A semiconductor memory device comprising:
    a plurality of memory cells, each comprising a single MOS transistor and a single capacitor;
    a main bit line pair comprising first and second main bit lines;
    a precharge circuit for precharging each said main bit line to a predetermined potential according to a precharge signal;
    a main sense amplifier for amplifying signals between said paired main bit lines;
    a sub-bit line pair, provided for said main bit line pair, comprising first and second sub-bit lines, said sub-bit line pair being connected to said plurality of memory cells;
    a plurality of word lines for selecting a specified memory cell from among said plurality of memory cells; and
    a sub-sense amplifier provided for said sub-bit line pair for amplifying a voltage between said first and second sub-bit lines to provide an amplified voltage to said main bit line pair; wherein,
    a word line corresponding to said memory cell is connected to the gate of said MOS transistor; and
    some of said memory cells are connected to the first main bit line by said capacitor thereof and connected to the second sub-bit line by said channel of said MOS transistor thereof, and other memory cells are connected to the second main bit line by said capacitor thereof and connected to the first sub-bit line by said channel of said MOS transistor thereof.

2. A semiconductor memory device according to claim 1,
    wherein said main sense amplifier is activated by a main sense amplifier activation signal, said sub-sense amplifier is activated by a sub-sense amplifier activation signal and connection between said first main bit line and said first sub-bit line and connection between said second main bit line and said second sub-bit line of said sub-sense amplifier are controlled by a transfer control signal; and
    said semiconductor memory device further comprises a control unit for generating said main sense amplifier activation signal, said sub-sense amplifier activation signal, said transfer control signal, said precharge signal, and a signal to be supplied to said word line for selection of a memory cell.

3. A semiconductor memory device according to claim 2, wherein,
    in an initial state, said control unit sets said precharge signal and said transfer control signal to an active level, said main sense amplifier activation signal and said sub-sense amplifier activation signal to an inactive level, and said word line to a nonselected level; and
    when said memory device has entered an operation state, after rendering said transfer control signal inactive, said control unit sets the word line corresponding to the memory cell to be selected to a selected level, then sets said precharge signal to the inactive level and said sub-sense amplifier activation signal to the active level, subsequently sets said transfer control signal to the active level and then said main sense amplifier activation signal to the active level, and after setting said word line to the nonselected level, sets said precharge signal to the active level, and said sub-sense amplifier activation signal and said main sense amplifier activation signal to the inactive level.

4. A semiconductor memory device according to claim 3, wherein said sub-sense amplifier comprises:
    a first transistor having the drain thereof connected to the first sub-bit line, the source thereof connected to a signal line transmitting sub-sense amplifier activation signals, and the gate thereof connected to the second sub-bit line;
    a second transistor having the drain thereof connected to the second sub-bit line, the source thereof connected to said signal line, and the gate thereof connected to the first sub-bit line;
    a third transistor into which said transfer control signal is input to connect said first main bit line and said first sub-bit line; and
    a fourth transistor into which said transfer control signal is input to connect said second main bit line and said second sub-bit line.

5. A semiconductor memory device according to claim 3, further comprising:
    a first plurality of said memory cells whose channels are connected to said first sub-bit line; and
    a second plurality of said memory cells whose channels are connected to said second sub-bit line.

6. A semiconductor memory device according to claim 3, comprising a plurality of sub-bit line pairs provided for corresponding said main bit line pair.

7. A semiconductor memory device according to claim 1, wherein, said main sense amplifier is activated by main sense amplifier activation signals; and said sub-sense amplifier receives a first transfer control signal for controlling connection thereof to the corresponding said main bit line pair, is activated by a sub-sense amplifier activation signal and amplifies the voltage between said paired sub-bit lines to transmit to the corresponding main bit line pair; and said semiconductor memory device further comprises:

a transfer control circuit into which a second transfer control signal is input for controlling connections between said first main bit line and said first sub-bit line and between said second main bit line and said second sub-bit line; and a control unit for generating said main sense amplifier activation signal, said sub-sense amplifier activation signal, said first and second transfer control signals, said precharge signal, and a signal to be supplied to said word line for selection of a memory cell.

8. (Amended) A semiconductor memory device according to claim 7, wherein, in an initial state, said control unit sets said precharge signal and said second transfer control signal to an active level, said first transfer control signal, said main sense amplifier activation signal and said sub-sense amplifier activation signal to an inactive level, and each said word line to a nonselected level; and when said memory device has entered an operation state, after rendering said second transfer control signal inactive, said control unit sets the word line corresponding to the memory cell to be selected to a selected level, then after setting said precharge signal to the inactive level and said first transfer control signal to the active level, sets said sub-sense amplifier activation signal to the active level, subsequently after setting said main sense amplifier activation signal to the active level, sets said second transfer control signal to the active level, and further after setting said word line to the nonselected level and said first transfer control signal to the nonselected level and said first transfer control signal to the inactive level, sets said precharge signal to the active level, and said sub-sense amplifier activation signal and said main sense amplifier activation signal to the inactive level.

9. A semiconductor memory device according to claim 8, wherein said sub-sense amplifier comprises:

a first transistor having the source thereof connected to a signal line transmitting the sub-sense amplifier activation signal, and the gate thereof connected to the second sub-bit line;

a second transistor having the source thereof connected to said signal line, and the gate thereof connected to the first sub-bit line;

a third transistor into which said first transfer control signals are input to connect said first main bit line and the drain of said first transistor; and a fourth transistor into which said first transfer control signals are input to connect said second main bit line and the drain of said second transistor; and said transfer control circuit comprises:

a fifth transistor into which said second transfer control signals are input to connect said first main bit line and said first sub-bit line; and a sixth transistor into which said second transfer control signals are input to connect said second main bit line and said second sub-bit line.

10. A semiconductor memory device according to claim 8, comprising:

a first plurality of said memory cells whose channels are connected to said first sub-bit line; and a second plurality of said memory cells whose channels are connected to said second sub-bit line.

11. A semiconductor memory device according to claim 8, comprising a plurality of sub-bit line pairs provided for said main bit line pair.

* * * * *